United States Patent
McCollum et al.

(10) Patent No.: US 11,114,348 B2
(45) Date of Patent: Sep. 7, 2021

(54) HYBRID HIGH-VOLTAGE LOW-VOLTAGE FINFET DEVICE

(71) Applicant: Microsemi SoC Corp., San Jose, CA (US)

(72) Inventors: John McCollum, Orem, UT (US); Fethi Dhaoui, Mountain House, CA (US); Pavan Singaraju, San Jose, CA (US)

(73) Assignee: Microsemi SoC Corp., San Jose, CA (US)

( * ) Notice: Subject to any disclaimer, the term of this patent is extended or adjusted under 35 U.S.C. 154(b) by 0 days.

(21) Appl. No.: 16/177,715

(22) Filed: Nov. 1, 2018

(65) Prior Publication Data

US 2019/0172756 A1 Jun. 6, 2019

Related U.S. Application Data

(60) Provisional application No. 62/594,349, filed on Dec. 4, 2017.

(51) Int. Cl.
*H01L 21/84* (2006.01)
*H01L 21/02* (2006.01)
(Continued)

(52) U.S. Cl.
CPC ...... *H01L 21/845* (2013.01); *H01L 21/02164* (2013.01); *H01L 21/26* (2013.01);
(Continued)

(58) Field of Classification Search
CPC ............... H01L 21/845; H01L 27/0886; H01L 21/823412; H01L 21/823431;
(Continued)

(56) References Cited

U.S. PATENT DOCUMENTS 6,090,652 A 7/2000 Kim
7,470,951 B2 12/2008 Mathew et al.
(Continued)

FOREIGN PATENT DOCUMENTS

EP 3166137 A1 5/2017

OTHER PUBLICATIONS

Kerber et al. "Reliability Challenges for CMOS Technology Qualifications With Hafnium Oxide/Titanium Nitride Gate Stacks" IEEE Transactions on Device and Materials Reliability, vol. 9, No. 2, Jun. 2009 (Year: 2009).*

(Continued)

*Primary Examiner* — Marcos D. Pizarro
(74) *Attorney, Agent, or Firm* — Glass & Associates; Kenneth D'Alessandro; Kenneth Glass

(57) ABSTRACT

An integrated circuit includes a plurality of low-voltage FinFET transistors each having a channel length l and a channel width w, the low-voltage FinFET transistors having a first threshold voltage channel implant and a first gate dielectric thickness. The integrated circuit also includes a plurality of high-voltage FinFET transistors each having the channel length l and the channel width w, the high-voltage FinFET transistors having a second threshold voltage channel implant greater than the first threshold voltage channel implant and second gate dielectric thickness greater than the first gate dielectric thickness.

12 Claims, 2 Drawing Sheets

(51) Int. Cl.
*H01L 27/12* (2006.01)
*H01L 29/06* (2006.01)
*H01L 27/11* (2006.01)
*H01L 21/26* (2006.01)
*H01L 21/8234* (2006.01)
*H01L 27/088* (2006.01)
*H01L 29/78* (2006.01)
*H01L 21/8238* (2006.01)
*H01L 29/66* (2006.01)
*H01L 27/092* (2006.01)

(52) U.S. Cl.
CPC ............... *H01L 21/823412* (2013.01); *H01L 21/823431* (2013.01); *H01L 21/823462* (2013.01); *H01L 27/0886* (2013.01); *H01L 27/1104* (2013.01); *H01L 27/1108* (2013.01); *H01L 27/1211* (2013.01); *H01L 29/0649* (2013.01); *H01L 21/823807* (2013.01); *H01L 21/823821* (2013.01); *H01L 27/0924* (2013.01); *H01L 29/66795* (2013.01); *H01L 29/785* (2013.01)

(58) Field of Classification Search
CPC ......... H01L 27/1104; H01L 21/823462; H01L 21/26; H01L 27/1108; H01L 29/0649; H01L 27/1211; H01L 21/02164; H01L 27/0924; H01L 21/823821; H01L 29/66795; H01L 21/823807; H01L 29/785
See application file for complete search history.

(56) References Cited

U.S. PATENT DOCUMENTS

| | | | |
|---|---|---|---|
| 8,723,223 B2* | 5/2014 | Bhuwalka | H01L 21/823431 257/192 |
| 2002/0016081 A1 | 2/2002 | Aloni et al. | |
| 2002/0020891 A1 | 2/2002 | Madurawe et al. | |
| 2003/0107913 A1 | 6/2003 | Nii | |
| 2006/0170066 A1* | 8/2006 | Mathew | H01L 27/11 257/401 |
| 2006/0172505 A1* | 8/2006 | Koester | H01L 21/76256 438/455 |
| 2007/0274124 A1 | 11/2007 | Otsuka | |
| 2012/0069636 A1 | 3/2012 | Pelley et al. | |
| 2013/0175611 A1* | 7/2013 | Shinohara | H01L 21/823821 257/334 |
| 2013/0214353 A1 | 8/2013 | Ito | |
| 2014/0363960 A1* | 12/2014 | Kim | H01L 21/82345 438/585 |
| 2015/0229307 A1 | 8/2015 | Badrudduza et al. | |
| 2016/0181428 A1* | 6/2016 | Chen | H01L 29/66545 257/401 |
| 2017/0301668 A1* | 10/2017 | Kim | H01L 21/761 |
| 2018/0069534 A1 | 3/2018 | Sugahara et al. | |
| 2019/0157157 A1* | 5/2019 | Siddiqui | H01L 21/02255 |
| 2019/0172522 A1 | 6/2019 | Greene et al. | |
| 2019/0172756 A1 | 6/2019 | McCollum et al. | |

OTHER PUBLICATIONS

International Search Report and Written Opinion, PCT/US2018/063428, dated Mar. 6, 2019.

* cited by examiner

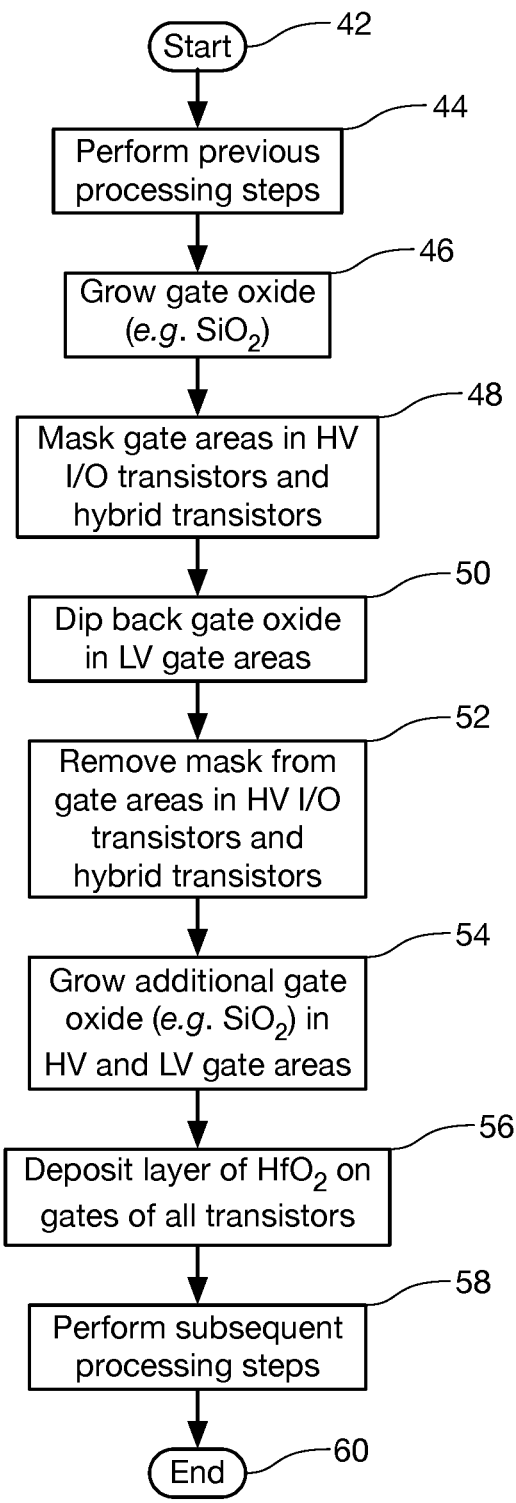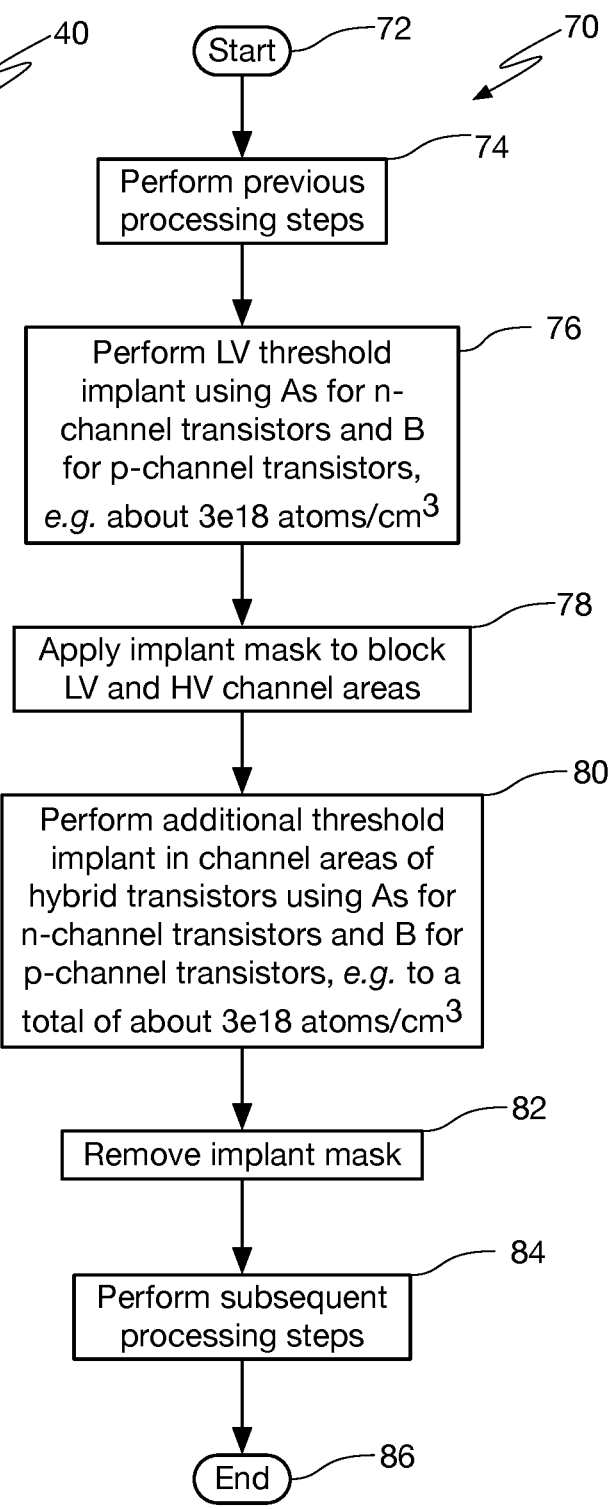

HYBRID HIGH-VOLTAGE LOW-VOLTAGE FINFET DEVICE

BACKGROUND

The present invention relates to field effect transistors (FETs). More particularly, the present invention relates to FinFET transistors.

Static random-access memory (SRAM) field programmable gate array (FPGA) integrated circuits have traditionally used ordinary NMOS planar transistor devices as switches. These transistor devices present two problems. The switches exhibit source-drain leakage when they are off. Further, such switches provide reduced performance compared to CMOS transmission gate switch devices because they do not pass the full VDD voltage.

In processes utilizing a 90 nm minimum feature size, at least one SRAM FPGA manufacturer introduced a customized transistor that is not a device normally available in a standard fabrication process. The device had a thicker oxide and could operate with its gate overdriven above VDD. These transistors are referred to as "mid-oxide" because they have a gate oxide thickness larger than normal low voltage devices but smaller than normal high-voltage devices employed in the process. See A. Telikepalli, "Power vs. Performance: The 90 nm Inflection Point," Xilinx White Paper, vol. 223, 2006, https://www.xilinix.com/support/documentation/white_papers/wp223.pdf. This approach required the modification of the fabrication process used to manufacture them in order to add the processing steps necessary to accommodate formation of the mid-thickness gate oxide layers but worked satisfactorily through 40 nm feature size technology.

However with the advent of FinFET transistor devices and the high-k gate processes used to fabricate them, it is no longer feasible to offer a mid-oxide device in the semiconductor fabrication processes employing these devices. See Charles Chiasson and Vaughn Betz, "Should FPGAs Abandon the Pass Gate?", 978-4799-004-6/13, IEEE 2013. http://www.eecg.toronto.edu/~charlesc/chiasson_fpl2013.pdf. As a result SRAM, FPGAs have, starting at 20 nm, used complementary CMOS transmission gates as switches. CMOS transmission gates do not require overdriving the gates of the p-channel and n-channel transistors in the transmission gate to pass a full VDD. However the tangled layout of a CMOS transmission gate substantially increases the die area required for the switch.

The RTG4™ family of FPGA integrated circuits manufactured and marketed by Microsemi SoC Corp., usea a custom planar n-channel switch transistor in a 65 nm planar process. Microsemi's PolarFire™ family of FPGA integrated circuits uses a custom planar n-channel switch transistor in a 28 nm planar process. However, because of the aforementioned processing issues, implementing a custom device with FinFET transistor devices is not an obvious extension of these planar devices.

In a planar transistor device, when the oxide is thickened the $V_t$ rises more than is desired. The $V_t$ is reduced by adjusting the doping to lower it, but it still remains above the $V_t$ of an ordinary low voltage planar transistor. In addition, there is flexibility to adjust the channel length as needed.

Especially with the complexity of FinFET technology, it becomes prohibitively difficult to modify the process to support custom devices. In FinFET, a thicker dielectric does not significantly affect the $V_t$. Also, because there is no back-gate effect in FinFET transistors, channel doping alone can only be used to make small adjustments to the $V_t$; significant control of the $V_t$ must be done by using conductive materials with different work functions to form the gate. For example, metal gates formed from TIAL are often used for n-channel FinFET transistors and the Vt can be further adjusted by implanting carbon or nitrogen; metal gates formed from TiN can be used for p-channel FinFET transistors and the Vt can be further adjusted by implanting fluorine. Finally, the channel length can only be adjusted in a quantized way, and only to the extent that it doesn't increase the pitch of the transistors (otherwise very significant spacing penalties are incurred). FinFET process and photolithography pitch rules are restricted due to the 14 nm geometries being made with 193 nm light. The devices must remain within the same poly pitch to avoid the heavy penalty of large spacing rules.

The terms "low-voltage" and "high-voltage" are used herein to characterize transistor devices having different structures that allow operation at different voltage levels. In any given semiconductor foundry that fabricates integrated circuits for customers, there are specifications for both "low-voltage" and "high-voltage" transistors that take into account minimum process feature sizes as well as operating voltage specifications. Low-voltage FinFET transistors are used for logic in the core of an integrated circuit device while high-voltage FinFET transistors are used as I/O devices in the integrated circuits.

Referring first of all to FIGS. 1, 2 and 3, diagrams show the layout of a typical prior-art low-voltage FinFET transistor device 10. FIG. 1 is a diagram depicting the layout of the prior-art FinFET transistor device 10 in a direction along the channel of the device. FIG. 2 is a diagram depicting a cross sectional view of the layout of the prior-art FinFET transistor device 10 of FIG. 1 across the channel at the lines 2-2. FIG. 3 is a diagram depicting the top view of the layout of the prior-art FinFET transistor device 10 of FIG. 1.

FinFET transistor device 10 is an ordinary low voltage FinFET. As known in the art, FinFET transistor device 10 is fabricated on substrate 12 and includes a thin fin of silicon body 14 extending vertically upward from the surface of the substrate 12. In a channel region 16 of the fin 14 a multi-layer gate dielectric formed from a first dielectric layer 18a formed from, for example, thermal $SiO_2$, and a second dielectric layer 18b formed from a high-k material, for example $HfO_2$, surrounds the fin 14. Gate dielectric layers 18a and 18b together have a thickness, such as 8 Å and 36 Å in one particular embodiment, respectively, sufficient to withstand the normal low-voltage gate potential that will be applied to the device. A gate 20 is formed on the second dielectric layer 18b. Gate 20 is formed from a metal such as titanium and/or tantalum, e.g., titanium nitride and/or tantalum nitride.

Persons of ordinary skill in the art will appreciate that in FinFET transistor device 10 the gate 20 is wrapped around the fin 14 on three sides to define the channel, which has a width w and length l, providing excellent control from the three sides (left, right, and top) of the channel as seen in FIG. 2. The portion of the fin 14 extending to the left of the gate 20 in FIG. 1 is the source 22 of the FinFET transistor 10 and the portion of the fin 14 extending to the right of the gate 20 in FIG. 1 is the drain 24 of the FinFET transistor 10. Where the FinFET transistor is an n-channel transistor, the source and drain regions 22 and 24 are implanted with a dopant such as arsenic. Where the FinFET transistor is a p-channel transistor, the source and drain regions 22 and 24 are implanted with a dopant such as boron.

BRIEF DESCRIPTION

The present invention is directed to a FinFET transistor that is a hybrid of high- and low-voltage device FinFET transistor types. The principles of the present invention apply to the fabrication of "hybrid" FinFET transistors. FinFET transistors fabricated in accordance with the present invention have gate oxide thicknesses of high-voltage transistors, the same channel length l and channel width w as low-voltage FinFET transistors, and a higher $V_t$ than either low-voltage and high-voltage transistors, and are referred to herein as "hybrid" FinFET transistors. The present invention contemplates fabrication of both n-channel and p-channel hybrid FinFET transistors.

The hybrid FinFET device of the present invention has the small area of a low-voltage FinFET. However the hybrid FinFET device of the present invention can also tolerate a higher voltage on its gate, making it feasible to overdrive the gate for good performance, even with a high threshold voltage. Because the hybrid FinFET device of the present invention has a higher channel threshold implant than that used to form both low-voltage and high-voltage FinFET transistor, the hybrid FinFET device of the present invention can also tolerate a higher source-to-drain voltage than a normal low-voltage transistor. Designing the hybrid FinFET transistor to have a higher threshold voltage than low voltage transistors on the integrated circuit is advantageous because it reduces the source-to-drain leakage when the device is in an off state.

The hybrid FinFET device of the present invention can be advantageously manufactured without having to make any changes to the process technology. All that is necessary is to make some geometry changes when generating the masks to permit the new combination of gate oxide and channel structure.

According to one aspect of the present invention, a process for fabricating the hybrid FinFET transistors of the present invention allows forming both n-channel and p-channel hybrid FinFET transistors without having to materially alter current fabrication processes.

BRIEF DESCRIPTION OF THE DRAWING FIGURES

The invention will be explained in more detail in the following with reference to embodiments and to the drawing in which are shown:

FIG. 7 is a flow diagram showing an illustrative gate dielectric processing sequence used to fabricate the hybrid FinFET transistor devices of the present invention along with low-voltage and high-voltage FinFET transistor devices.

FIG. 8 is a flow diagram showing an illustrative threshold implant processing sequence used to fabricate the hybrid FinFET transistor devices of the present invention along with low-voltage and high-voltage FinFET transistor devices.

DETAILED DESCRIPTION

Persons of ordinary skill in the art will realize that the following description of the present invention is illustrative only and not in any way limiting. Other embodiments of the invention will readily suggest themselves to such skilled persons.

Figures 4, 5, 6:
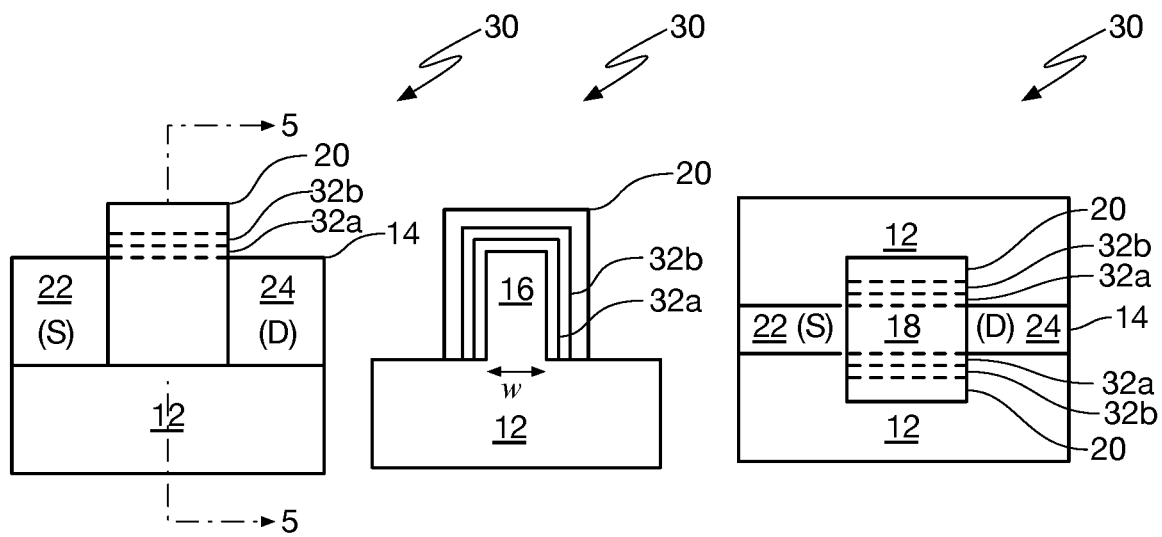
FIG. 4 is a diagram depicting the layout of a hybrid FinFET transistor in accordance with the present invention in a direction along the channel of the device.
FIG. 5 is a diagram depicting a cross sectional view of the layout of the hybrid FinFET transistor device of FIG. 4 across the channel at the lines 2-2.
FIG. 6 is a diagram depicting the top view of the layout of the hybrid FinFET transistor device of FIG. 3.

Referring now to FIGS. 4, 5, and 6, side and top views show a hybrid FinFET transistor device 30 in accordance with one aspect of the present invention, where: FIG. 4 is a diagram depicting the layout of the hybrid FinFET transistor device 30 in a direction along the channel of the device; FIG. 5 is a diagram depicting a cross sectional view of the layout of the hybrid FinFET transistor device 30 of FIG. 4 across the channel at the lines 5-5; and FIG. 6 is a diagram depicting the top view of the layout of the hybrid FinFET transistor device 30 of FIG. 4. Some features of hybrid FinFET transistor device 30 are common to FinFET transistor device 10, and these features will be identified in FIGS. 4-6 using the same reference numerals used in FIGS. 1-3.

Figures 1, 2, 3:
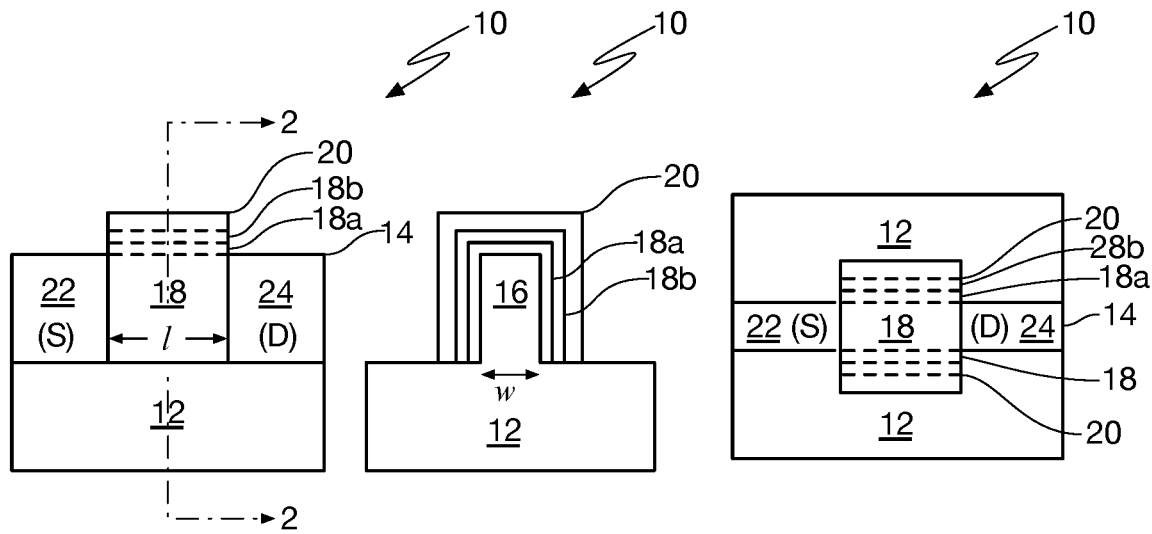
FIG. 1 is a diagram depicting the layout of a prior-art FinFET transistor in a direction along the channel of the device.
FIG. 2 is a diagram depicting a cross sectional view of the layout of the prior-art FinFET device of FIG. 1 across the channel at the lines 2-2.
FIG. 3 is a diagram depicting the top view of the layout of the prior-art FinFET device of FIG. 1.

Like the prior-art FinFET transistor device 10 of FIGS. 1-3, the hybrid FinFET transistor device 30 of FIGS. 4 through 6 is fabricated on substrate 12 and includes a thin fin of silicon body 14 extending vertically upward from the surface of the substrate 12. In a channel region 16 of the fin 14 a multi-layer gate dielectric formed from a first dielectric layer 32a formed from, for example, thermal $SiO_2$, and a second dielectric layer 32b formed from a high-k material, for example $HfO_2$, surrounds the fin 14. Gate dielectric layers 32a and 32b together have a thickness, such as 30 Å and 36 Å in one particular embodiment, respectively, sufficient to withstand the high-voltage gate potential that will be applied to the device. Gate 20 is formed from a metal such as titanium and/or tantalum, e.g., titanium nitride and/or tantalum nitride.

Persons of ordinary skill in the art will appreciate that in hybrid FinFET transistor device 30 the gate is wrapped around the fin 14 on three sides to define the channel, which has the same width w and length l as the low-voltage FinFET transistor device 10 depicted in FIGS. 1 through 3, providing excellent control from the three sides (left, right, and top) of the channel as seen in FIG. 5. The portion of the fin 14 extending to the left of the gate 20 in FIG. 4 is the source 22 of the hybrid FinFET transistor device 30 and the portion of the fin 14 extending to the right of the gate 18 in FIG. 1 is the drain 24 of the hybrid FinFET transistor device 30. Where the hybrid FinFET transistor device 30 is an n-channel transistor, the source and drain regions 22 and 24 are implanted with a dopant such as arsenic. Where the hybrid FinFET transistor device 30 is a p-channel transistor, the source and drain regions 22 and 24 are implanted with a dopant such as boron.

According to another aspect of the present invention illustrated in FIGS. 7 and 8, the n-channel and p-channel FinFET transistor devices according to the present invention may be fabricated using conventional processing steps currently employed in semiconductor foundries, with a few variations that are compatible with these processes.

Referring now to FIG. 7, a flow diagram shows an illustrative gate dielectric processing sequence 40 that may be used to fabricate the hybrid FinFET transistor device 30 of the present invention along with conventional low-voltage and high-voltage FinFET transistor devices. The process sequence begins at reference numeral 42.

At reference numeral 44, processing steps that precede gate dielectric formation are performed as is known in the art. At reference numeral 46, a layer of dielectric material such as $SiO_2$ is formed over the fin. In one particular embodiment of the invention, this layer is formed to a thickness of about 22 Å. Then, at reference numeral 48 a gate masking layer is applied to the gate regions of both the hybrid FinFET transistors and the high-voltage FinFET transistors being fabricated. The gate oxide layer is then dipped back in the unmasked low-voltage transistors at reference numeral 50. At reference numeral 52, the gate masking layer is removed.

At reference numeral 54 an additional layer of a dielectric such as $SiO_2$ is formed in the gate regions of all low-voltage, hybrid, and high-voltage FinFET transistors. In one particular embodiment of the invention, this layer is formed to a thickness of about 8 Å. Because the initial layer of dielectric material remains on the hybrid FinFET transistors and the high-voltage FinFET transistors, the total thickness of the combination of layers on the hybrid FinFET transistors and on the high-voltage FinFET transistors increases to about 30 Å, while the thickness of the single layer on the low-voltage FinFET transistors is about 8 Å.

At reference numeral 56, a second dielectric layer formed from, for example, $HfO_2$, is formed over of the gate regions of all low-voltage, hybrid, and high-voltage FinFET transistors. In one particular embodiment of the invention, this $HfO_2$ layer is formed to a thickness of about 36 Å. At reference numeral 58, subsequent processing steps are performed to further fabricate the integrated circuit containing the low-voltage, hybrid, and high-voltage FinFET transistors of the present invention. The process ends at reference numeral 60.

As will be appreciated by persons of ordinary skill in the art, the total thickness of the gate dielectric layers in the low-voltage FinFET transistors is about 44 Å and the total thickness of the gate dielectric layers in the hybrid FinFET transistors and the high-voltage FinFET transistors is about 66 Å. There is no additional processing that needs to be performed in the process to form gate dielectric regions for the hybrid FinFET transistors of the present invention. The only change to the process involves altering the geometry of the gate masking layer used to protect the high-voltage transistor gate regions from the dip back of the first dielectric region in the exposed low-voltage transistor gate regions at reference numeral 50 by also covering the gate regions of low-voltage form factor FinFET transistor structures that are going to be hybrid FinFET transistors. This simple change in the geometry of an existing mask already used in the fabrication in the process does not affect, and thus is compatible with, the basic fabrication process.

Referring now to FIG. 8, a flow diagram shows an illustrative threshold implant processing sequence 70 that may be used to fabricate the FinFET transistor devices of the present invention along with low-voltage FinFET transistor devices. The process sequence begins at reference numeral 72.

At reference numeral 74, processing steps that precede threshold channel implant formation are performed as is known in the art. At reference numeral 76, a low-voltage threshold implant is performed for all FinFET transistors in the integrated circuit. Then, at reference numeral 78 an implant masking layer is applied to the substrate to cover the channel regions of the low-voltage and the high-voltage FinFET transistors. The channel regions of the hybrid FinFET transistors remain exposed. At reference numeral 80, an additional channel threshold implant is performed in the exposed channel regions of the hybrid FinFET transistors. At reference numeral 82, the implant masking layer is removed. At reference numeral 84, subsequent processing steps are performed to further fabricate the integrated circuit containing the low-voltage, hybrid, and high-voltage FinFET transistors. The process ends at reference numeral 86.

The process sequence shown in FIG. 8 is generic to a channel threshold implant sequence for both n-channel FinFET and p-channel hybrid FinFET transistors. In a process for fabricating integrated circuits having both n-channel and p-channel hybrid FinFET transistor devices, the channel threshold implant process sequence shown in FIG. 8 is simply performed twice, once for n-channel hybrid transistors and once for p-channel hybrid transistors. In the case of n-channel hybrid transistors, according to one exemplary embodiment of the invention, the channel doping is performed using arsenic to about $3e18$ atoms/$cm^3$ in both low-voltage and high-voltage transistor channels and to about $5e18$ atoms/$cm^3$ in hybrid transistor channels. In the case of p-channel hybrid transistors, according to one exemplary embodiment of the invention, the channel doping is performed using boron to about $3e18$ atoms/$cm^3$ in low-voltage and high-voltage transistor channels and to about $5e18$ atoms/$cm^3$ in hybrid transistor channels.

As will be appreciated by persons of ordinary skill in the art, the only modification to the process that needs to be made in the channel threshold process sequence to implant low-voltage, hybrid, and high-voltage channel threshold implants for FinFET transistors is the application of the implant masking layer to cover the low-voltage and high-voltage transistor channel regions at reference numeral 78, the additional hybrid channel threshold implant performed in the exposed hybrid transistor channel regions at reference numeral 80, and the removal of the implant masking layer at reference numeral 82. As with the high-voltage gate dielectric formation process sequence, this additional processing does not materially affect and thus is compatible with the basic fabrication process. These are acceptable process modifications in that they do not affect other devices and may be implemented at a minimum cost.

According to one exemplary embodiment of the present invention, the channel implant doping levels result in VtLin=0.457V, Vtsat=0.363V, Sub-Threshold Slope=87 mV/Dec, and Ioff=200 pA@0.8V for the low-voltage transistors and VtLin=0.622V, Vtsat=0.511V, Sub-Threshold Slope=82 mV/Dec, and Ioff=2 pA@0.8V for the high-voltage transistors. In several applications it is desired to have a low source to drain leakage as the higher gate voltage allows more overdrive. This is achieved by increasing the doping from 3E18 to 5E18 thus reducing the Source to Drain leakage to 2 pA in the hybrid FinFET transistor device of the present invention. The low leakage value (2 pA) of Ioff for the high-voltage transistors makes these devices particularly suitable for use in SRAM memory cells. The hybrid FinFET transistor device of the present invention is suitable for an FPGA switch with an overdriven gate, where the source-drain voltage is limited to VDD.

There are other applications of the hybrid device, such as protect or addressing devices. In this case, the source-drain voltage must be higher. In such applications, two hybrid FinFET devices of the present invention can be connected in series to overcome and issues resulting from their shorter channel length.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated circuit including a plurality of low-voltage FinFET transistors formed on a substrate, each low-voltage FinFET transistor including a first gate dielectric having a plurality of layers, the plurality of layers including a first dielectric layer formed from a first dielectric material having a first thickness and a second dielectric layer formed from a second dielectric material different from the first dielectric material and having a second thickness, the second dielectric material being a high-k dielectric material and overlying the first dielectric layer, the integrated circuit comprising:
   a plurality of hybrid FinFET transistors, each hybrid FinFET transistor formed on the substrate and including:
   a respective fin extending upward from the substrate;
   a second gate dielectric surrounding a portion of the fin, the second gate dielectric having a greater thickness than the thickness of the first gate dielectric layer in each of the plurality of low-voltage FinFET transistors, the second gate dielectric including a first layer formed from the first dielectric material having a third thickness, a second layer formed from the first dielectric material overlying the first layer of the first dielectric material that is the same layer as the first dielectric layer in the first gate and having the first thickness, and a third layer formed from the second dielectric material overlying the second layer of the first dielectric material that is the same layer as the high-k material second dielectric layer in the first gate and having the second thickness;
   a gate electrode disposed over the second gate dielectric and surrounding a portion of the fin, a channel in the respective fin defined by a portion of the fin disposed surrounded by the gate electrode;
   portions of the respective fin extending past opposite edges of the gate electrode forming source and drain regions,
   the channel in the respective fin formed by:
      performing a low-voltage threshold implant in the channel regions of both the low-voltage FinFET transistors and the hybrid FinFET transistors; and
      performing an additional implant in the channel region of each of the hybrid FinFET transistors.

2. The integrated circuit of claim 1 wherein the plurality of low-voltage FinFET transistors are n-channel FinFET transistors and the plurality of hybrid FinFET transistors are n-channel FinFET transistors.

3. The integrated circuit of claim 1 wherein the plurality of low-voltage FinFET transistors are p-channel FinFET transistors and the plurality of hybrid FinFET transistors are p-channel FinFET transistors.

4. The integrated circuit of claim 1 wherein the plurality of low-voltage FinFET transistors include both n-channel FinFET transistors and p-channel FinFET transistors and the plurality of hybrid FinFET transistors include both n-channel FinFET transistors and p-channel FinFET transistors.

5. The integrated circuit of claim 1 wherein the first dielectric material is $SiO_2$ and the second dielectric material is $HfO_2$.

6. The integrated circuit of claim 1 wherein the doping level of each of the plurality of low-voltage FinFET transistors is about 3e18 atoms/cm² and the doping level of each of the hybrid FinFET transistors is about 5e18 atoms/cm².

7. An integrated circuit including a plurality of low-voltage FinFET transistors, each low-voltage FinFET transistor including a first gate dielectric having a plurality of layers, the plurality of layers including a first dielectric layer formed from a first dielectric material having a first thickness and a second dielectric layer formed from a second dielectric material different from the first dielectric material and having a second thickness, the second dielectric material being a high-k material and overlying the first dielectric layer, the integrated circuit comprising:
   a plurality of hybrid FinFET transistors, each hybrid FinFET transistor formed on a substrate and including:
   a respective fin extending upward from the substrate;
   a second gate dielectric surrounding a portion of the respective fin, the second gate dielectric having a greater thickness than the thickness of the first gate dielectric in each of the plurality of low-voltage FinFET transistors, the second gate dielectric including a first layer formed from the first dielectric material having a third thickness, a second layer formed from the first dielectric material overlying the first layer of the first dielectric material that is the same layer as the first dielectric layer in the first gate and having the first thickness, and a third layer formed from the second dielectric material overlying the second layer of the first dielectric material that is the same layer as the high-k material second dielectric layer in the first gate and having the second thickness;
   a gate electrode disposed over the second gate dielectric and surrounding a portion of the respective fin;
   portions of the respective fin extending past opposite edges of the gate electrode forming source and drain regions;
   a channel that extends between the source region and the drain region, the channel defined as a portion of the respective fin between the source region and the drain region that is surrounded by the gate electrode, the channel having a channel length that is the same as a channel length of each of the plurality of low-voltage FinFET transistors, having a channel width that is the same as a channel width of each of the plurality of low-voltage FinFET transistors and having a doping level that is greater than a doping level of each of the plurality of low-voltage FinFET transistors.

8. The integrated circuit of claim 7 wherein the plurality of low-voltage FinFET transistors are n-channel FinFET transistors and the plurality of hybrid FinFET transistors are n-channel FinFET transistors.

9. The integrated circuit of claim 7 wherein the plurality of low-voltage FinFET transistors are p-channel FinFET transistors and the plurality of hybrid FinFET transistors are p-channel FinFET transistors.

10. The integrated circuit of claim 7 wherein the plurality of low-voltage FinFET transistors include both n-channel FinFET transistors and p-channel FinFET transistors and the plurality of hybrid FinFET transistors include both n-channel FinFET transistors an p-channel FinFET transistors.

11. The integrated circuit of claim 7 wherein the first dielectric material is $SiO_2$ and the second dielectric material is $HfO_2$.

12. The integrated circuit of claim 7 wherein the doping level of each of the plurality of low-voltage FinFET transistors is about 3e18 atoms/cm$^2$ and the doping level of each of the hybrid FinFET transistors is about 5e18 atoms/cm$^2$.

* * * * *